United States Patent
Chindo

(10) Patent No.: US 9,319,056 B2
(45) Date of Patent: Apr. 19, 2016

(54) QUANTUM INTERFERENCE DEVICE, ATOMIC OSCILLATOR, ELECTRONIC APPARATUS, AND MOVING OBJECT

(71) Applicant: Seiko Epson Corporation, Tokyo (JP)

(72) Inventor: Koji Chindo, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/574,970

(22) Filed: Dec. 18, 2014

(65) Prior Publication Data
US 2015/0180490 A1 Jun. 25, 2015

(30) Foreign Application Priority Data

Dec. 20, 2013 (JP) .................... 2013-264663

(51) Int. Cl.
*H03L 7/26* (2006.01)
*G04F 5/14* (2006.01)

(52) U.S. Cl.
CPC .... *H03L 7/26* (2013.01); *G04F 5/14* (2013.01)

(58) Field of Classification Search
CPC .......................................................... H03L 7/26
USPC ..................................................... 331/94.1, 3
See application file for complete search history.

(56) References Cited

U.S. PATENT DOCUMENTS

2012/0212298 A1* 8/2012 Lecomte et al. ............. 331/94.1

FOREIGN PATENT DOCUMENTS

JP 2007-324818 A 12/2007

* cited by examiner

*Primary Examiner* — Joseph Chang
(74) *Attorney, Agent, or Firm* — Harness, Dickey & Pierce, P.L.C.

(57) ABSTRACT

A quantum interference device includes a gas cell into which metal atoms are sealed, a heater that heats the gas cell, a heat transmission portion that is located between the gas cell and the heater, is connected to the gas cell, and transmits heat generated from the heater to the gas cell, and a heat dissipation portion that is connected to the gas cell so as to be spaced apart from the heat transmission portion, and dissipates heat of the gas cell.

10 Claims, 10 Drawing Sheets

QUANTUM INTERFERENCE DEVICE, ATOMIC OSCILLATOR, ELECTRONIC APPARATUS, AND MOVING OBJECT

BACKGROUND

1. Technical Field

The present invention relates to a quantum interference device, an atomic oscillator, an electronic apparatus, and a moving object.

2. Related Art

As for an oscillator which has a high accuracy oscillation characteristic for a long period of time, an atomic oscillator is known which oscillates on the basis of energy transition of atoms of an alkali metal such as rubidium or cesium.

Generally, operation principles of the atomic oscillator are largely classified into a method of using a double resonance phenomenon caused by light and microwaves, and a method of using a quantum interference effect (also referred to as coherent population trapping (CPT)) caused by two types of light beams with different wavelengths.

In an atomic oscillator of either method, an alkali metal is sealed into a gas cell along with buffer gases, and the gas cell is required to be heated to a predetermined temperature by a heater in order to maintain the alkali metal in a specific gaseous phase.

Here, generally, the entire alkali metal in the gas cell does not become a gas, and part of the alkali metal becomes a liquid as a surplus. Such surplus alkali metal atoms are deposited (condensed) at a location of the gas cell where a temperature is low and thus become a liquid, but if the liquid of the surplus alkali metal atoms is present in a passing region of the excitation light to shield the excitation light, as a result, an oscillation characteristic of the atomic oscillator deteriorates.

Therefore, in a gas cell disclosed in JP-A-2007-324818, a recess for depositing an alkali metal is provided at a position which is deviated from an optical axis of excitation light. Apart which is separated from the recess of the gas cell is heated by a heater, and thus a temperature of the recess is made lower than that of a peripheral portion. Thus, a surplus of the alkali metal is reserved in the recess as a liquid, so that the surplus is prevented from shielding the excitation light.

However, in a case where an atomic oscillator disclosed in JP-A-2007-324818 is miniaturized, heat generated from the heater is transmitted to the entire atomic oscillator depending on its size. For this reason, a temperature of the recess also increases. As a result, there is a possibility that the surplus of the alkali metal may not be reserved in the recess as a liquid and thus the surplus may shield the excitation light. As mentioned above, it is difficult to partially change a temperature of the gas cell of the miniaturized atomic oscillator.

SUMMARY

An advantage of some aspects of the invention is to provide a quantum interference device, an atomic oscillator, an electronic apparatus, and a moving object, capable of partially changing a temperature of a gas cell so as to minimize deterioration in characteristics due to surplus metal atoms.

The invention can be implemented as the following forms or application examples.

Application Example 1

This application example is directed to a quantum interference device including: a gas cell into which metal atoms are sealed; a heating portion that heats the gas cell; a heat transmission portion that is located between the gas cell and the heating portion, is connected to the gas cell, and transmits heat generated from the heating portion to the gas cell; and a heat dissipation portion that is connected to the gas cell so as to be spaced apart from the heat transmission portion, and dissipates heat of the gas cell.

With this configuration, it is possible to effectively form a low temperature portion whose temperature is lower than that of a peripheral portion in the relatively small gas cell. Thus, the metal atoms can be condensed in the low temperature portion, and a surplus thereof can be reserved as a liquid. As mentioned above, since the surplus can be easily controlled, it is possible to easily prevent the surplus from shielding an optical path of excitation light and thus to improve reliability of the quantum interference device.

Application Example 2

In the quantum interference device according to the application example, it is preferable that the heat dissipation portion is disposed on an opposite side to the heating portion side of the gas cell.

With this configuration, heat of the heating portion can be effectively transmitted to the gas cell by the heat transmission portion, and heat of the gas cell can be effectively dissipated by the heat dissipation portion.

Application Example 3

In the quantum interference device according to the application example, it is preferable that the gas cell includes a pair of windows through which light is transmitted, and the heat dissipation portion is connected to each of the windows.

With this configuration, it is possible to increase an area of a part where the gas cell is connected to the heat dissipation portion as much as possible. Thus, the heat dissipation portion can effectively dissipate heat of the gas cell.

Application Example 4

In the quantum interference device according to the application example, it is preferable that the gas cell includes a pair of windows through which light is transmitted, and the heat transmission portion is connected to each of the windows.

With this configuration, it is possible to increase an area of a part where the gas cell is connected to the heat transmission portion as much as possible. Thus, the heat transmission portion can effectively transmit heat generated from the heating portion to the gas cell.

Application Example 5

In the quantum interference device according to the application example, it is preferable that a region of the gas cell through which the light passes is located further toward the heat transmission portion side than the heat dissipation portion side.

With this configuration, it is possible to reliably heat a part of the gas cell through which excitation light passes. Therefore, it is possible to effectively prevent a surplus of the metal atoms from being condensed at the part of the gas cell through which excitation light passes.

Application Example 6

It is preferable that the quantum interference device according to the application example further includes a coil that generates a magnetic field in the gas cell, the heat transmission portion, the gas cell, and the heat dissipation portion are located inside the coil, and the heating portion is located outside the coil.

With this configuration, it is possible to generate a magnetic field in the gas cell, and also to connect the heat transmission portion and the heat dissipation portion to the gas cell without using the coil.

Application Example 7

It is preferable that the quantum interference device according to the application example further includes a magnetic shield that has a magnetic shield property and is located between the coil and the heating portion.

With this configuration, a magnetic field can be stabilized in the gas cell, and, in a case where a magnetic field is generated from the heating portion, the generated magnetic field can be effectively prevented from influencing the magnetic field in the gas cell.

Application Example 8

In the quantum interference device according to the application example, it is preferable that the heating portion is connected to the magnetic shield.

With this configuration, heat generated from the heating portion is transmitted to the magnetic shield.

Application Example 9

In the quantum interference device according to the application example, it is preferable that an end of the heat transmission portion on the heat dissipation portion side and an end of the heat dissipation portion on the heat transmission portion side face each other, and have areas different from each other.

With this configuration, when compared with a case where an end of the heat transmission portion on the heat dissipation portion side and an end of the heat dissipation portion on the heat transmission portion side have the same area as each other, it is possible to minimize transmission of heat through a gap therebetween.

Application Example 10

This application example is directed to an atomic oscillator including the quantum interference device according to the application example.

With this configuration, it is possible to provide an atomic oscillator having high reliability and good oscillation characteristics.

Application Example 11

This application example is directed to an electronic apparatus including the quantum interference device according to the application example.

With this configuration, it is possible to provide an electronic apparatus having high reliability and good oscillation characteristics.

Application Example 12

This application example is directed to a moving object including the quantum interference device according to the application example.

With this configuration, it is possible to provide a moving object having high reliability and good oscillation characteristics.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, with reference to the accompanying drawings, a detailed description will be made of a quantum interference device, an atomic oscillator, an electronic apparatus, and a moving object according to embodiments of the invention.

1. Atom Oscillator (Quantum Interference Device)

First, an atomic oscillator (an atomic oscillator including a quantum interference device according to an embodiment of the invention) according to an embodiment of the invention will be described. In addition, hereinafter, an example in which a quantum interference device according to an embodiment of the invention is applied to an atomic oscillator will be described, but the invention is not limited thereto, and the quantum interference device is applicable to, for example, a magnetic sensor and a quantum memory.

First Embodiment

Figure 1:
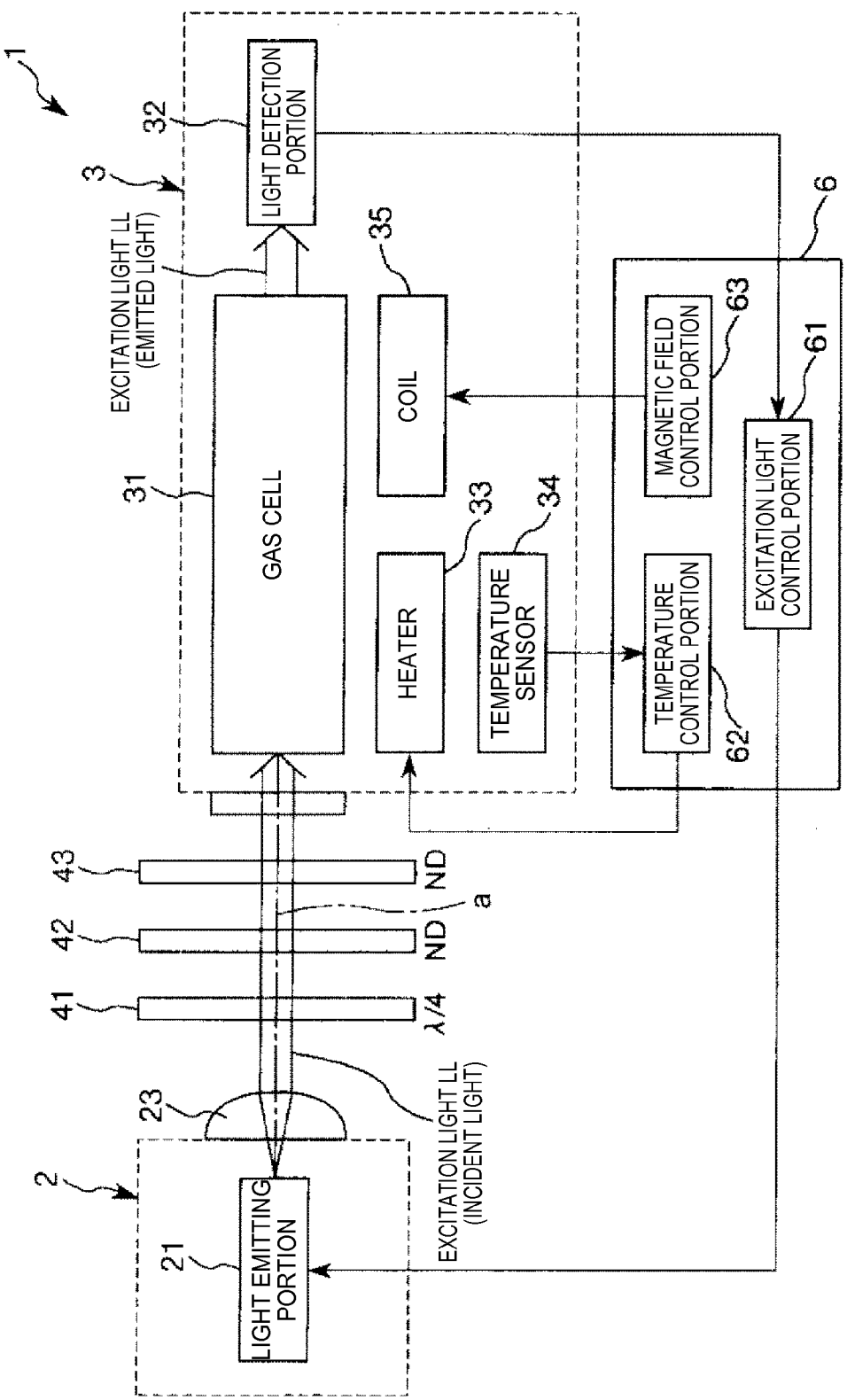
FIG. 1 is a schematic diagram illustrating a configuration of an atomic oscillator (quantum interference device) according to a first embodiment of the invention.
Figure 2:
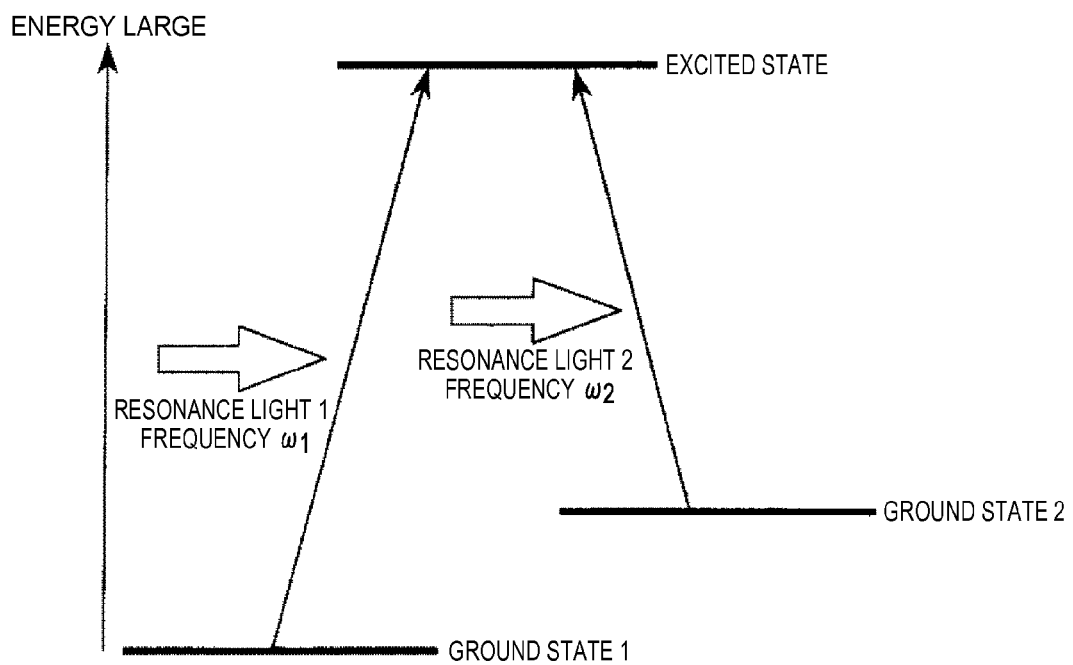
FIG. 2 is a diagram illustrating an energy state of an alkali metal.
Figure 3:
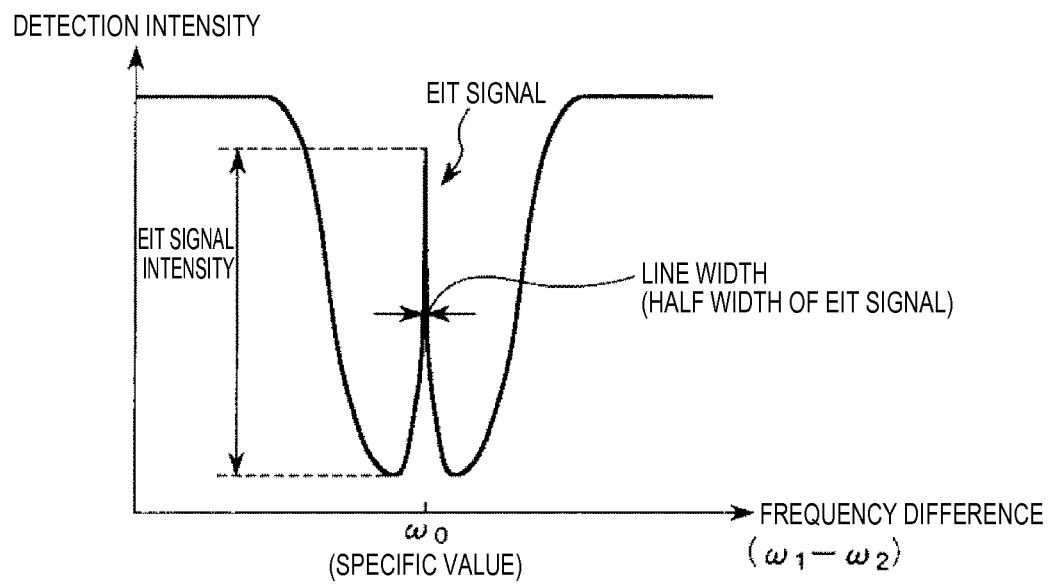
FIG. 3 is a graph illustrating a relationship between a frequency difference between two light beams emitted from a light emitting portion, and an intensity of light detected by a light detection portion.

FIG. 1 is a schematic diagram illustrating an atomic oscillator (quantum interference device) according to a first embodiment of the invention. In addition, FIG. 2 is a diagram illustrating an energy state of an alkali metal, and FIG. 3 is a graph illustrating a relationship between a frequency difference between two light beams emitted from a light emitting portion, and an intensity of light detected by a light detection portion.

The atomic oscillator 1 illustrated in FIG. 1 uses a quantum interference effect.

The atomic oscillator 1, as illustrated in FIG. 1, includes a first unit 2 which is a unit of a light emission side, a second unit 3 which is a unit of a light detection side, optical components 41, 42 and 43 provided between the units 2 and 3, and a controller 6 which controls the first unit 2 and the second unit 3.

Here, the first unit 2 includes a light emitting portion 21 and a first package 22 which stores the light emitting portion 21.

The second unit 3 includes a gas cell 31, a light detection portion 32, a coil 35, a heat transmission portion 8, a heat dissipation portion 9, a magnetic shield 38 which stores the above-described constituent elements, a heater (heating portion) 33, and a temperature sensor 34.

First, a principle of the atomic oscillator 1 will be described briefly.

As illustrated in FIG. 1, in the atomic oscillator 1, the light emitting portion 21 emits excitation light LL toward the gas cell 31, and the light detection portion 32 detects the excitation light LL which has been transmitted through the gas cell 31.

A gaseous alkali metal (metal atoms) is sealed into the gas cell 31. The alkali metal has energy levels of a three-level system as illustrated in FIG. 2, and may take three states including two ground states (ground states 1 and 2) with different energy levels and an excited state. Here, the ground state 1 is an energy state lower than the ground state 2.

The excitation light LL emitted from the light emitting portion 21 includes two types of resonance light beams 1 and 2. When the above-described gaseous alkali metal is irradiated with the two types of resonance light beams 1 and 2, light absorptance (light transmittance) of the resonance light beams 1 and 2 in the alkali metal varies depending on a difference ($\omega_1-\omega_2$) between a frequency $\omega_1$ of the resonance light 1 and a frequency $\omega_2$ of the resonance light 2.

When the difference ($\omega_1-\omega_2$) between the frequency $\omega_1$ of the resonance light 1 and the frequency $\omega_2$ of the resonance light 2 matches a frequency corresponding to an energy difference between the ground state 1 and the ground state 2, excitation from the ground states 1 and 2 to the excited state stops, respectively. At this time, neither of the resonance light beams 1 and 2 is absorbed by the alkali metal, but both are transmitted therethrough. This phenomenon is called a CPT phenomenon or an electromagnetically induced transparency (EIT) phenomenon.

For example, if the light emitting portion 21 fixes the frequency $\omega_1$ of the resonance light 1 to a certain value and changes the frequency $\omega_2$ of the resonance light 2, when the difference ($\omega_1-\omega_2$) between the frequency $\omega_1$ of the resonance light 1 and the frequency $\omega_2$ of the resonance light 2 matches a frequency $\omega_0$ corresponding to an energy difference between the ground state 1 and the ground state 2, an intensity detected by the light detection portion 32 rapidly increases as illustrated in FIG. 3. This rapidly increasing signal is detected as an EIT signal. The EIT signal has an inherent value which is defined by the kind of alkali metal. Therefore, an oscillator can be formed by using such an EIT signal.

Hereinafter, a specific configuration of the atomic oscillator 1 according to the present embodiment will be described.

Figure 4:
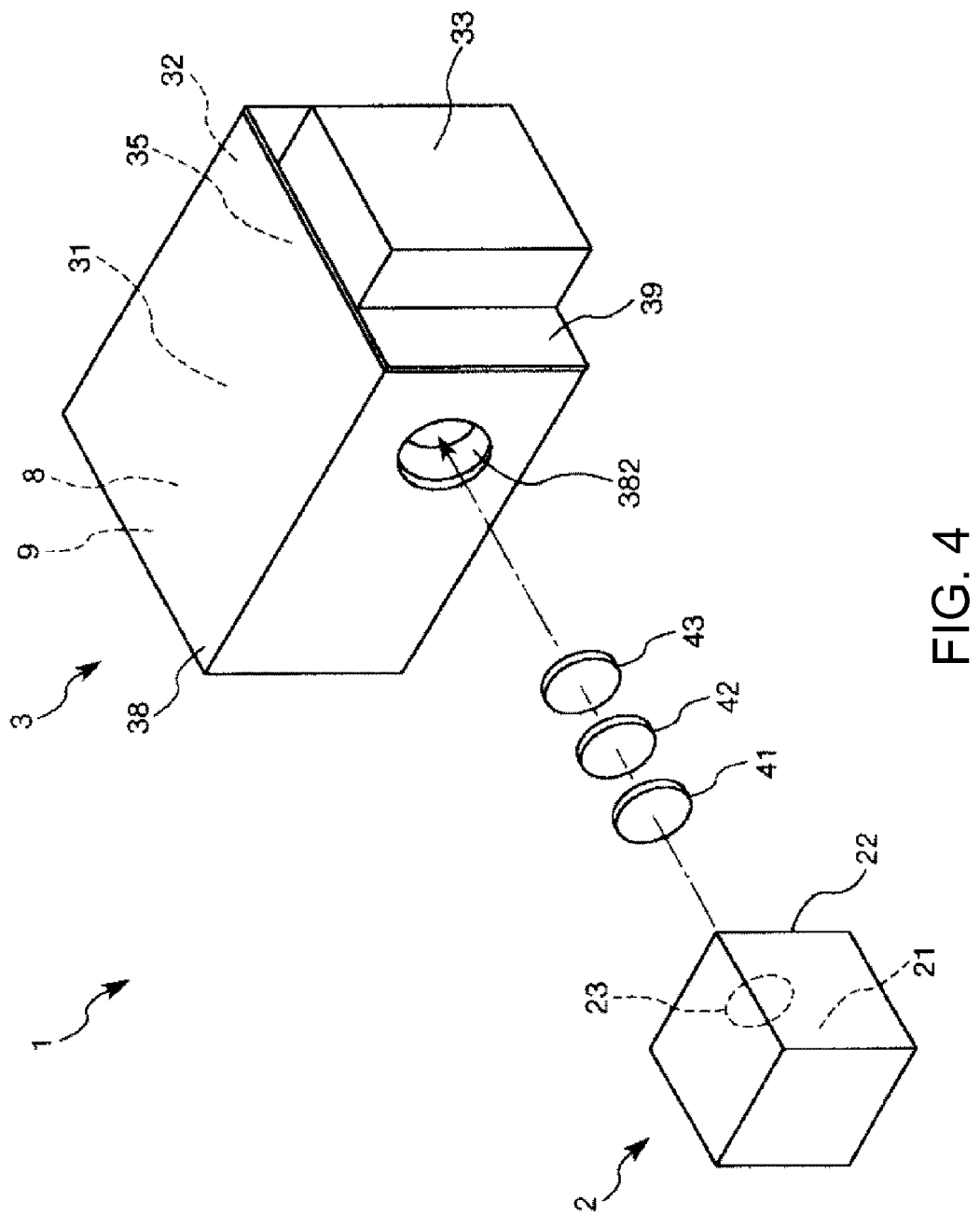
FIG. 4 is a perspective view schematically illustrating the atomic oscillator (quantum interference device) illustrated in FIG. 1.
Figure 5:
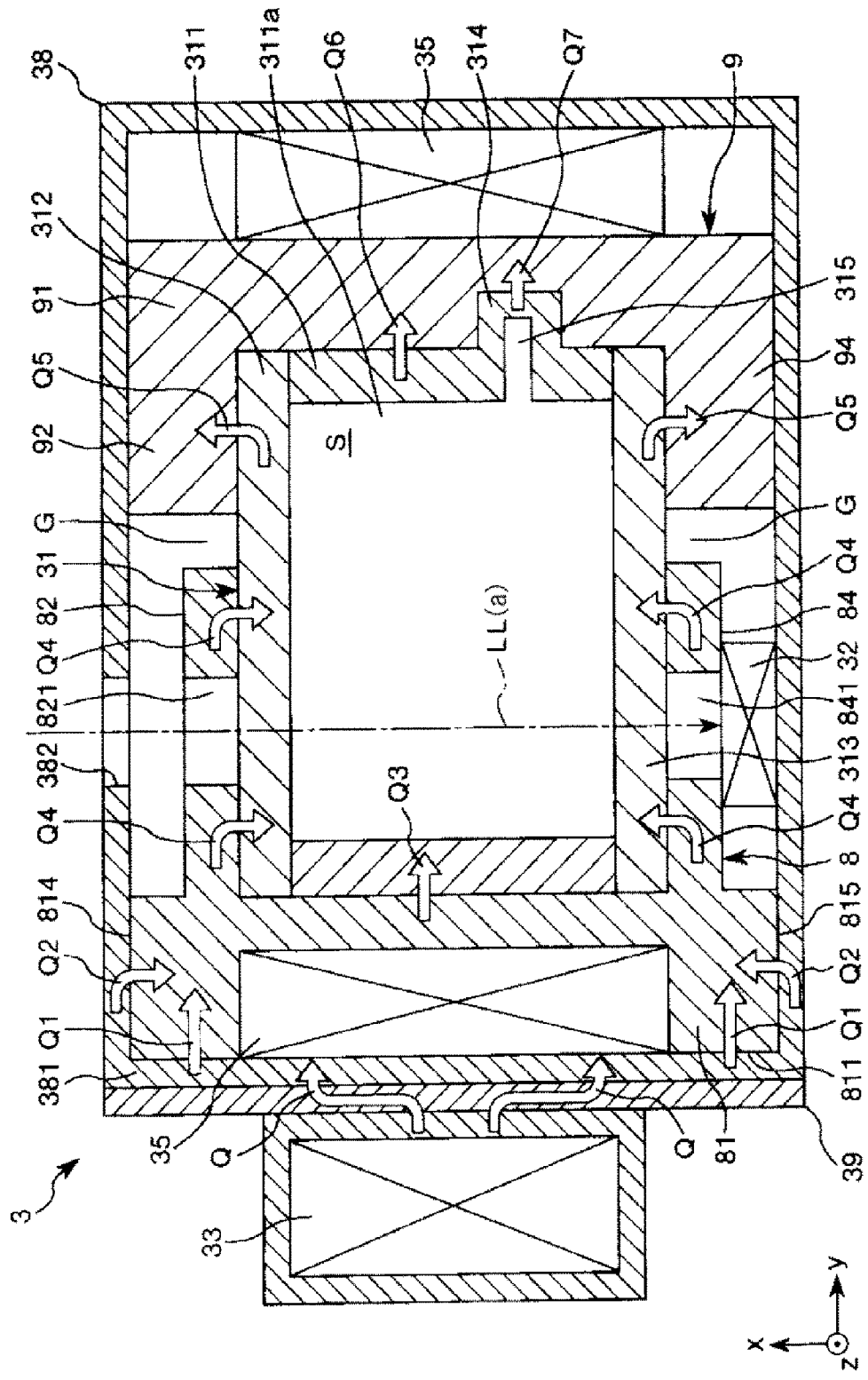
FIG. 5 is a cross-sectional view of a second unit included in the atomic oscillator illustrated in FIG. 1.
Figure 6:
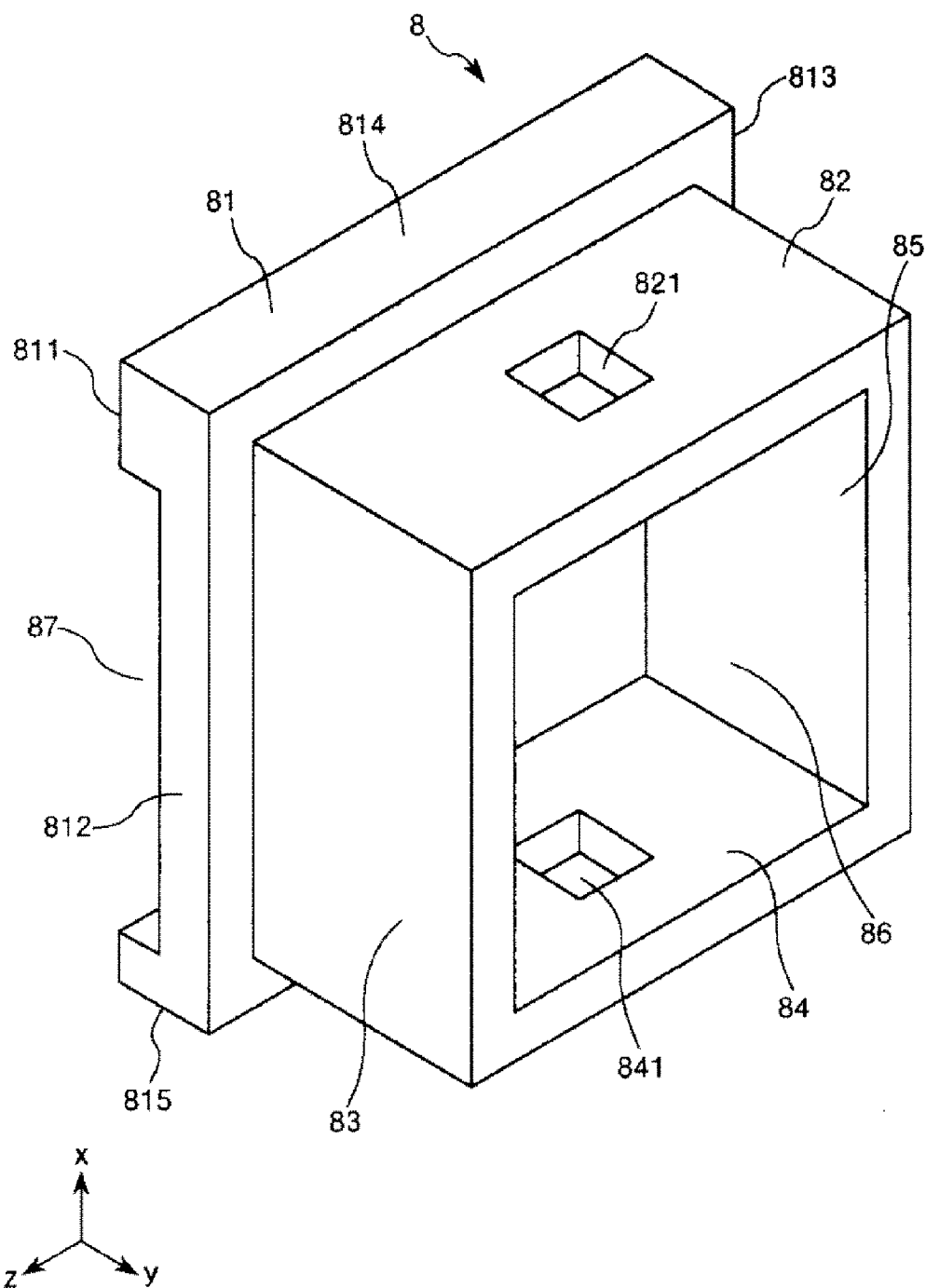
FIG. 6 is a perspective view of a light transmission portion illustrated in FIG. 5.

FIG. 4 is a perspective view schematically illustrating the atomic oscillator (quantum interference device) illustrated in FIG. 1, FIG. 5 is a cross-sectional view of the second unit included in the atomic oscillator illustrated in FIG. 1, and FIG. 6 is a perspective view of the heat transmission portion illustrated in FIG. 5. Hereinafter, a top side of each of FIGS. 4 to 6 is also referred to as an "upper side", and a bottom side of FIG. 5 is also referred to as a "lower side". In addition, in FIGS. 4 to 6, for convenience of description, an x axis, a y axis, a z axis are illustrated as three axes which are perpendicular to each other, and a tip end side of each arrow illustrated in each drawing is referred to as "+(positive) side", and a base end side is referred to as "−(negative) side". Further, hereinafter, for convenience of description, a direction parallel to the x axis is also referred to as an "x axis direction", a direction parallel to the y axis is also referred to as a "y axis direction", and a direction parallel to the z axis is also referred to as a "z axis direction".

As illustrated in FIG. 4, the atomic oscillator 1 includes the first unit 2, the second unit 3, the optical components 41, 42 and 43, and the controller 6.

The first unit 2 and the second unit 3 are electrically connected to the controller 6 via a wiring and a connector (not illustrated) and are controlled to be driven by the controller 6.

Hereinafter, each part of the atomic oscillator 1 will be described in order.

First Unit

As described above, the first unit 2 includes the light emitting portion 21 and the first package 22 which stores the light emitting portion 21.

Light Emitting Portion

The light emitting portion 21 has a function of emitting the excitation light LL for exciting alkali metal atoms in the gas cell 31.

More specifically, the light emitting portion 21 emits light including the above-described two types of light beams (the resonance light 1 and the resonance light 2) as the excitation light LL.

The frequency $\omega_1$ of the resonance light 1 can excite (resonate) the alkali metal in the gas cell 31 from the above-described ground state 1 to the excited state.

The frequency $\omega_2$ of the resonance light 2 can excite (resonate) the alkali metal in the gas cell 31 from the above-described ground state 2 to the excited state.

The light emitting portion 21 is not particularly limited as long as the above-described excitation light LL can be emitted, but, for example, a semiconductor laser such as a vertical cavity surface emitting laser (VCSEL) may be used.

In addition, a temperature of the light emitting portion 21 is adjusted to a predetermined temperature by a temperature adjustment element (a heating resistor, a Peltier element, or the like) (not illustrated).

First Package

The first package 22 stores the above-described light emitting portion 21.

The first package 22 is constituted by a block-shaped casing in its appearance as illustrated in FIG. 4. For example, a plurality of leads protrude from the first package 22, and are electrically connected to the light emitting portion 21 via a wiring. Each of the leads is electrically connected to a wiring board via a connector (not illustrated). As the connector, for example, a flexible board or a socket-shaped board may be used.

A window portion 23 is provided at a wall of the first package 22 on the second unit 3 side. The window portion 23 is provided on an optical axis (an axis a of the excitation light LL) between the gas cell 31 and the light emitting portion 21. The window portion 23 transmits the excitation light LL therethrough.

In the present embodiment, the window portion 23 is a lens. Consequently, the excitation light LL can be applied to the gas cell 31 without any waste. The window portion 23 has a function of converting the excitation light LL into parallel light. That is, the window portion 23 is a collimator lens, and the excitation light LL in an inner space S is parallel light. Thus, it is possible to increase the number of alkali metal atoms which are resonated by the excitation light LL emitted from the light emitting portion 21, among the alkali metal atoms present in the inner space S. As a result, it is possible to increase an intensity of the EIT signal.

The window portion 23 is not limited to the lens as long as the excitation light LL can be transmitted therethrough, and may be, for example, optical components other than a lens, and may be a simple light-transmissive tabular member. In this case, the lens having the above-described function may be provided between the first package 22 and the magnetic shield 38 in the same manner as the optical components 41, 42 and 43 described later.

Materials forming the portions of the first package 22 other than the window portion 23 are not particularly limited, but, for example, ceramics, a metal, or a resin may be used.

Here, in a case where the portions of the first package 22 other than the window portion 23 are made of a material which transmits the excitation light therethrough, the portions of the first package 22 other than the window portion 23 may be integrally formed with the window portion 23. In addition, in a case where the portions of the first package 22 other than the window portion 23 are made of a material which does not transmit the excitation light therethrough, the portions of the first package 22 other than the window portion 23 may be formed separately from the window portion 23, and may be joined thereto by using well-known joint methods.

A space in the first package 22 is preferably air-tightly formed. Consequently, the first package 22 can be made in a decompressed state or in an inert gas sealed state, and, as a result, it is possible to improve characteristics of the atomic oscillator 1.

For example, a temperature adjustment element which adjusts a temperature of the light emitting portion 21 or a temperature sensor (not illustrated) is stored in the first package 22. As such a temperature adjustment element, for example, there may be a heating resistor (heater) or a Peltier element.

According to the first package 22, the first package 22 can store the light emitting portion 21 while allowing the excitation light from the light emitting portion 21 to be emitted to the outside of the first package 22.

Second Unit

As described above, the second unit 3 includes the gas cell 31, the light detection portion 32, the coil 35, the heat transmission portion 8, the heat dissipation portion 9, and the magnetic shield 38 which stores the above-described constituent elements, the heater 33, and the temperature sensor 34.

Gas Cell

An alkali metal such as gaseous rubidium, cesium or sodium is sealed into the gas cell 31. A rare gas such as argon or neon, or an inert gas such as nitrogen may be sealed as a buffer gas in the gas cell 31 along with the alkali metal gas as necessary.

For example, as illustrated in FIG. 5, the gas cell 31 includes a main body 311 which has a through hole 311*a*, and a pair of windows 312 and 313 which seal both openings of the through hole 311*a*. Thus, the inner space S in which the above-described alkali metal is sealed is formed.

A protrusion 314 which protrudes outward is formed at part of the main body 311, and inside of the protrusion 314 functions as a liquid reservoir 315. The liquid reservoir 315 is a portion in which part of the alkali metal becomes a liquid and is reserved as a surplus. As described later, a temperature of the liquid reservoir 315 is made lower than that of a peripheral portion, and thus the surplus can be condensed and be reserved in the liquid reservoir 315.

A material forming the main body 311 is not particularly limited, but, for example, a metal material, a resin material, a glass material, a silicon material, quartz crystal, or the like may be used. From the viewpoint of workability or joining with the windows 312 and 313, the glass material or the silicon material is preferably used.

The main body 311 is air-tightly joined to the windows 312 and 313. Consequently, the inner space S of the gas cell 31 can be formed as an air-tight space.

A method of joining the main body 311 to the windows 312 and 313 is not particularly limited as long as the method is defined according to a forming material, but, for example, a joint method using an adhesive, a direct joint method, and an anodic joint method may be used.

A material forming the windows 312 and 313 is not particularly limited as long as the material can transmit the excitation light LL therethrough, but, for example, a resin material, a glass material, or quartz crystal may be used.

The windows 312 and 313 transmit the excitation light LL from the light emitting portion 21 therethrough. One window 312 transmits the excitation light LL which is incident to the gas cell 31 therethrough, and the other window 313 transmits the excitation light LL which is emitted out of the gas cell 31 therethrough.

The gas cell 31 is heated by the heater 33 so as to be adjusted to a predetermined temperature.

Light Detection Portion

The light detection portion 32 has a function of detecting an intensity of the excitation light LL (the resonance light beams 1 and 2) which has been transmitted through the gas cell 31.

The light detection portion 32 is not particularly limited as long as the excitation light can be detected, but, for example, a light detector (light receiving element) such as a solar cell or a photodiode may be used.

The light detection portion 32 is stored in the magnetic shield 38 but may be provided outside the magnetic shield 38. In this case, the magnetic shield 38 is provided with a window portion through which the excitation light LL having passed through the gas cell 31 passes.

Coil

The coil 35 has a function of generating a magnetic field in the direction (parallel direction) along the axis a of the excitation light LL in the inner space S. Thus, gaps between degenerated other energy levels of the alkali metal atoms in the inner space S are enlarged by the Zeeman splitting, and thus resolution can be improved. As a result, it is possible to reduce a line width of the EIT signal.

A magnetic field generated by the coil 35 may be either a DC magnetic field or an AC magnetic field, and a magnetic field is obtained when a DC magnetic field overlaps an AC magnetic field.

The coil 35 is not particularly limited. For example, the coil 35 may be wound along an outer circumference of the gas cell 31 so as to form a solenoid coil, and a pair of coils may oppose each other with the gas cell 31 interposed therebetween so as to form Helmholtz coils.

In the present embodiment, the coil 35 is constituted by a solenoid coil and is wound along the outside of the heat transmission portion 8, the gas cell 31, and the heat dissipation portion 9.

The coil 35 is electrically connected to a magnetic field control portion 63 of the controller 6, described later, via a wiring (not illustrated). Thus, the coil 35 can be conducted.

Magnetic Shield

The magnetic shield 38 is constituted by a casing having a block shape in its appearance, and stores the coil 35, the heat transmission portion 8, the gas cell 31, and the heat dissipation portion 9 therein. The magnetic shield 38 has a magnetic shield property and has a function of shielding the alkali metal in the gas cell 31 from an external magnetic field. Consequently, it is possible to improve stability of a magnetic field of the coil 35 in the magnetic shield 38. Therefore, it is possible to improve oscillation characteristics of the atomic oscillator 1.

A wall of the magnetic shield 38 on the first unit side is provided with a window 382 which penetrates therethrough in its thickness direction. Consequently, light emitted from the light emitting portion 21 can be incident into the gas cell 31 through the window 382.

As a material forming the magnetic shield 38, a material having a magnetic shield property is cited, and, for example, a soft magnetic material such as Fe or various iron-based alloys (silicon iron, permalloy, amorphous, Sendust, Kovar) is cited, and, among them, an Fe-Ni alloy such as kovar and permalloy is preferably used from the viewpoint of having a good magnetic shield property.

For example, a plurality of leads (not illustrated) protrude from the magnetic shield 38 and are electrically connected to the light detection portion 32, the heater 33, the temperature sensor 34, and the coil 35 via a wiring. Each lead is electrically connected to the wiring board via a connector (not illustrated). As the connector, for example, a flexible board or a socket-shaped board may be used.

Heater

The heater 33 has a function of heating the above-described gas cell 31 (more specifically, the alkali metal in the gas cell 31). Thus, the alkali metal in the gas cell 31 can be maintained in a gaseous phase of a desired concentration.

The heater 33 generates heat due to conduction, and is formed by, for example, a heating resistor provided on an outer surface of the gas cell 31. This heating resistor is formed by using, for example, a chemical vapor deposition method (CVD) such as plasma CVD or thermal CVD, a dry plating method such as vacuum deposition, or a sol/gel method.

Here, in a case where the heating resistor is provided at an incidence portion or an emission portion of the excitation light LL in the gas cell 31, the heating resistor is made of a material which transmits the excitation light therethrough, specifically, a transparent electrode material such as an oxide, for example, indium tin oxide (ITO), indium zinc oxide (IZO), $In_2O_3$, $SnO_2$, Sb-containing $SnO_2$, or Al-containing ZnO.

The heater 33 is connected to the magnetic shield 38 on an outer part thereof via a heat transmission plate 39 having relatively high thermal conductivity. As described above, the heater 33 generates heat due to conduction, and thus a magnetic field is generated when heat is generated. However, since the heater 33 is located outside the magnetic shield 38, it is possible to effectively prevent a magnetic field generated from the heater 33 from exerting an influence on a magnetic field generated from the coil 35 in the gas cell 31.

The heater 33 is not particularly limited as long as the gas cell 31 can be heated, and may not be in contact with the gas cell 31. In addition, the gas cell 31 may be heated by using a Peltier element instead of the heater 33 or along with the heater 33.

The heater 33 is electrically connected to a temperature control portion 62 of the controller 6, described later, so as to be conducted.

Temperature Sensor

The temperature sensor 34 detects a temperature of the heater 33 or the gas cell 31. In addition, a heating amount of the above-described heater 33 is controlled on the basis of a detection result from the temperature sensor 34. Thus, the alkali metal atoms in the gas cell 31 can be maintained at a desired temperature.

In addition, a position where the temperature sensor 34 is installed is not particularly limited, and, for example, the temperature sensor 34 may be installed on the heater 33, and may be installed on the outer surface of the gas cell 31.

The temperature sensor 34 is not particularly limited, and well-known temperature sensors such as a thermistor and a thermocouple may be used.

The temperature sensor 34 is electrically connected to the temperature control unit 62 of the controller 6, described later, via a wiring (not illustrated).

Optical Components

The plurality of optical components 41, 42 and 43 are provided between the first unit 2 and the second unit 3. The plurality of optical components 41, 42 and 43 are provided on the optical axis (the axis a) between the light emitting portion 21 in the first package 22 and the gas cell 31.

Here, in the present embodiment, the optical component 41, the optical component 42, and the optical component 43 are disposed in this order from the first unit 2 side to the second unit 3 side.

The optical component 41 is a λ/4 wavelength plate. Thus, for example, in a case where excitation light from the light emitting portion 21 is linearly polarized light, the excitation light can be converted into circularly polarized light (right-handed circularly polarized light or left-handed circularly polarized light).

As described above, in a state in which the alkali metal atoms in the gas cell 31 are Zeeman-split by a magnetic field of the coil 35, if linearly polarized excitation light is applied to the alkali metal atoms, the alkali metal atoms are uniformly distributed to and are present in a plurality of levels in which the alkali metal atoms are Zeeman-split due to an interaction between the excitation light and the alkali metal atoms. As a result, since the number of alkali metal atoms with a desired energy level becomes smaller than the number of alkali metal atoms with other energy levels, the number of atoms showing a desired EIT phenomenon is reduced, thus an intensity of a desired EIT signal decreases, and, as a result, an oscillation characteristic of the atomic oscillator 1 deteriorates.

In contrast, as described above, in a state in which the alkali metal atoms in the gas cell 31 are Zeeman-split by a magnetic field of the coil 35, if circularly polarized excitation light is applied to the alkali metal atoms, the number of alkali metal atoms with a desired energy level can be made larger than the number of alkali metal atoms with other energy levels among a plurality of levels in which the alkali metal atoms are Zeeman-split due to an interaction between the excitation light and the alkali metal atoms. For this reason, the number of atoms showing a desired EIT phenomenon increases, thus an intensity of a desired EIT signal also increases, and, as a result, an oscillation characteristic of the atomic oscillator 1 can be improved.

A shape of the optical component 41 in a plan view is not limited thereto, and may be a polygonal shape such as a quadrangular or pentagonal shape.

The optical components 42 and 43 are disposed on the second unit 3 side so as to correspond to the optical component 41.

The optical components 42 and 43 are dimming filters (ND filters). Thus, an intensity of the excitation light LL which is incident to the gas cell 31 can be adjusted (reduced). For this reason, even in a case where an output level of the light emitting portion 21 is high, the excitation light incident to the gas cell 31 can be adjusted to a desired light amount. In the present embodiment, an intensity of the excitation light LL which has been converted into circularly polarized light by the optical component 41 is adjusted by the optical components 42 and 43.

In the present embodiment, each of the optical components 42 and 43 is tabular.

A shape of each of the optical components 42 and 43 in a plan view is not limited thereto, and may be a polygonal shape such as a quadrangular or pentagonal shape.

Dimming rates of the optical component 42 and the optical component 43 may or may not be the same as each other.

The optical components 42 and 43 may have portions of which dimming rates are different continuously or stepwise on the upper sides and the lower sides. In this case, positions of the optical components 42 and 43 are adjusted vertically with respect to the wiring board, and thus a dimming rate of the excitation light can be adjusted.

Each of the optical components 42 and 43 may have a portion of which a dimming rate is different continuously or intermittently in a circumferential direction. In this case, the optical components 42 and 43 are rotated, and thus a dimming rate of the excitation light can be adjusted. In addition, in this case, a rotation center of the optical components 42 and 43 may be deviated from the axis a.

One of the optical components 42 and 43 may be omitted. In a case where an output level of the light emitting portion 21 is appropriate, both of the optical components 42 and 43 may be omitted.

The optical components 41, 42 and 43 are not limited to the types, the arrangement order, the number thereof described above, and the like. For example, the optical components 41, 42 and 43 are not limited to the λ/4 wavelength plate or the dimming filter, respectively, and may be lenses, polarization plates, or the like.

Controller

The controller 6 illustrated in FIG. 1 has a function of controlling each of the heater 33, the coil 35, and the light emitting portion 21.

In the present embodiment, the controller 6 is constituted by an integrated circuit (IC) chip.

The controller 6 includes the excitation light control portion 61 which controls frequencies of the resonance light beams 1 and 2 from the light emitting portion 21, the temperature control portion 62 which controls a temperature of the alkali metal in the gas cell 31, and the magnetic field control portion 63 which controls a magnetic field applied to the gas cell 31.

The excitation light control portion 61 controls frequencies of the resonance light beams 1 and 2 which are emitted from the light emitting portion 21 on the basis of a detection result from the above-described light detection portion 32. More specifically, the excitation light control portion 61 controls frequencies of the resonance light beams 1 and 2 emitted from the light emitting portion 21 so that the frequency difference ($\omega_1 - \omega_2$) detected by the light detection portion 32 becomes the inherent frequency $\omega_0$ of the alkali metal.

In addition, although not illustrated, the excitation light control portion 61 is provided with a voltage controlled quartz crystal oscillator (oscillation circuit), and outputs an oscillation frequency of the voltage controlled quartz crystal oscillator as an output signal of the atomic oscillator 1 while synchronously adjusting the oscillation frequency on the basis of a detection result from the light detection portion 32.

In addition, the temperature control portion 62 controls a current which flows to the heater 33 on the basis of a detection result from the temperature sensor 34. Thus, the gas cell 31 can be maintained in a desired temperature range.

Further, the magnetic field control portion 63 controls a current which flows to the coil 35 so as to make a magnetic field generated by the coil 35 constant.

The above description relates to each part of the atomic oscillator 1.

Next, a positional relationship between the heat transmission portion 8, the heat dissipation portion 9, and the second unit 3 will be described.

Heat Transmission Portion

As illustrated in FIG. 5, the heat transmission portion 8 disposed outside the gas cell 31 is connected to the gas cell 31. The heat transmission portion 8 is made of a material having relatively high thermal conductivity, and has a function of transmitting heat generated from the heater 33 to the gas cell 31. In the present specification, a state in which heat can move between respective members is referred to as a state in which the respective members are "connected" to each other. In other words, if heat moves between the respective members, a state in which the respective members are in contact with each other and a state in which the respective members are not in contact with each other (for example, a state in which the respective members are fixed via an adhesive or the like) are also included in a "connection" state.

As illustrated in FIG. 6, the heat transmission portion 8 includes a base 81 which has a square tabular shape when viewed from the y axis direction with the y axis direction as a thickness direction, and four walls 82, 83, 84 and 85 which are erected from an edge of the base 81 in the +y axis direction. The wall 82 and the wall 84 face each other in the x axis direction, the wall 82 is located on the +x axis side, and the wall 84 is located on the −x axis side. The wall 83 and the wall 85 face each other in the z axis direction, the wall 83 is located on the +z axis side, and the wall 85 is located on the −z axis side. The walls 82 to 85 are connected to each other and are formed in a tubular shape as a whole. A part surrounded by the base 81 and the walls 82 to 85 forms a first recess 86 into which part of the gas cell 31 is inserted.

The base 81 has a surface 811 located on the −y axis size, surfaces 812 and 813 which oppose each other in the z axis direction, and surfaces 814 and 815 which oppose each other in the x axis direction. A second recess 87 which is open to the surface 811 and is also open to the surfaces 812 and 813 is formed at the base 81. The second recess 87 is a part into which part of the coil 35 is inserted. Consequently, it is possible to reduce an outer diameter of the coil 35 in proportion to the formed second recess 87. Therefore, it is possible to miniaturize the atomic oscillator 1.

The wall 82 is provided with a window 821 which penetrates in a thickness direction thereof, and the wall 84 is provided with a window 841 which penetrates in a thickness direction thereof. The windows 821 and 841 overlap each other when viewed from the x axis direction. Therefore, the excitation light LL can be incident to the light detection portion 32 through the window 821, the windows 312 and 313 of the gas cell 31, and the window 841 in this order in a state in which the gas cell 31 is inserted into the first recess 86.

Heat Dissipation Portion

As illustrated in FIG. 5, the heat dissipation portion 9 is disposed outside the gas cell 31 and is connected to the gas cell 31. The heat dissipation portion 9 is made of a material having relatively high thermal conductivity and has a function of dissipating heat from the gas cell 31.

Figure 7:
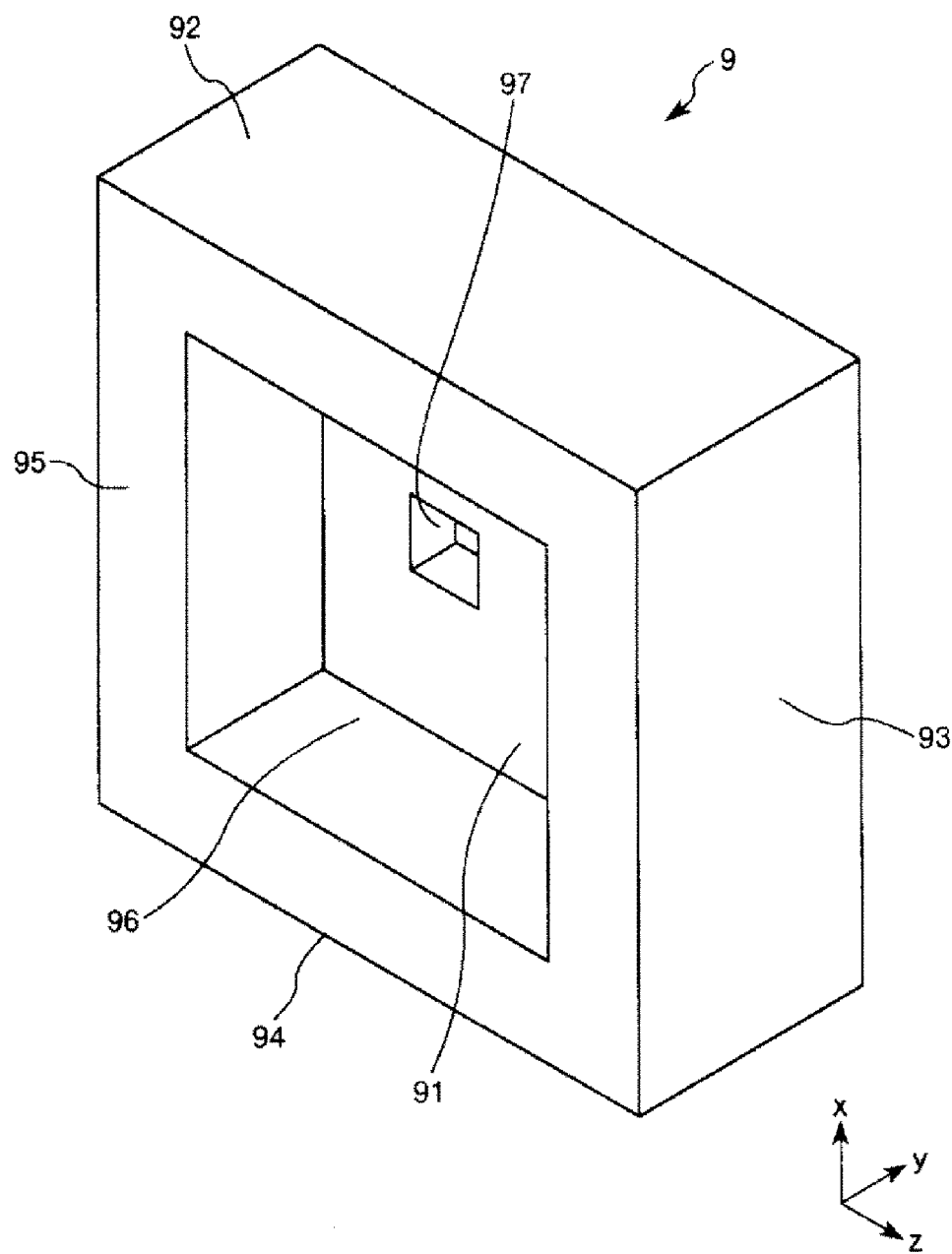
FIG. 7 is a perspective view of a heat dissipation portion illustrated in FIG. 5.

As illustrated in FIG. 7, the heat dissipation portion 9 includes a base 91 which has a square tabular shape when viewed from the y axis direction with the y axis direction as a thickness direction, and four walls 92, 93, 94 and 95 which are erected from an edge of the base 91 in the −y axis direction. The wall 92 and the wall 94 face each other in the x axis direction, the wall 92 is located on the +x axis side, and the wall 94 is located on the −x axis side. The wall 93 and the wall 95 face each other in the z axis direction, the wall 93 is located on the +z axis side, and the wall 95 is located on the −z axis side.

A part surrounded by the base 91 and the walls 92 to 95 form a third recess 96 into which part of the gas cell 31 is inserted. Each of the walls 92 to 95 is thicker than each of the walls 82 to 85 of the heat transmission portion 8.

A fourth recess 97 which is open to a surface facing the third recess 96 is formed at the base 91. The fourth recess 97 is a part into which the protrusion 314 of the gas cell 31 is inserted.

Meanwhile, the atomic oscillator 1, particularly, the gas cell 31 is relatively small-sized, and is small enough to be substantially uniformly heated as a whole in a case where the gas cell 31 is heated. For this reason, it is hard for the gas cell 31 to have a temperature distribution. In other words, it is hard to form a low temperature portion whose temperature is lower than a peripheral portion at the gas cell 31.

However, in the atomic oscillator 1, not only the heat transmission portion 8 but also the heat dissipation portion 9 is connected to the gas cell 31. Consequently, a low temperature portion can be provided at apart corresponding to the heat dissipation portion 9 of the gas cell 31. Therefore, a surplus alkali metal can be condensed around the low temperature portion of the inner space S. In the invention, arrangement positions of the heat transmission portion 8 and the heat dissipation portion 9 are adjusted, and thus it is possible to easily control a position where a surplus is reserved in the inner space S. For this reason, it is possible to easily reserve the surplus at a position separated from the part through which the excitation light LL passes. As a result, it is possible to effectively minimize deterioration in characteristics of the atomic oscillator 1 caused by the surplus shielding the excitation light LL. The heat transmission portion 8 and the heat dissipation portion 9 are provided to be spaced apart from each other. Thus, it is possible to prevent heat from being directly transmitted from the heat transmission portion 8 to the heat dissipation portion 9, and thus to reliably achieve the above-described effect in the atomic oscillator 1.

Materials forming the heat transmission portion 8 and the heat dissipation portion 9 are not limited thereto, and, for example, metal materials having relatively high thermal conductivity, such as various metal materials, may be used. Material forming the heat transmission portion 8 and the heat dissipation portion 9 are preferably materials having higher thermal conductivity than that of a material forming the gas cell 31. Consequently, in the atomic oscillator 1, it is possible to reliably achieve the above-described effect.

Positional Relationship between Respective Portions of Second Unit

Next, a detailed description will be made of a positional relationship between the respective portions of the second unit 3.

In the atomic oscillator 1, the heat transmission portion 8 and the heat dissipation portion 9 are disposed outside the gas cell 31 so that the gas cell 31 is inserted into the first recess 86 of the heat transmission portion 8 and the part protruding from the first recess 86 of the gas cell 31 is inserted into the third recess 96 of the heat dissipation portion 9. In this state, the gas cell 31 is connected to the heat transmission portion 8 and the heat dissipation portion 9. Specifically, the gas cell 31 and the heat transmission portion 8 are connected to each other at the base 81 and inner surfaces of the walls 82 to 85 of the heat transmission portion 8. The gas cell 31 and the heat dissipation portion 9 are connected to each other at the base 91 and inner surfaces of the walls 92 to 95 of the heat dissipation portion 9.

The coil 35 is provided outside the heat transmission portion 8, the gas cell 31, and the heat dissipation portion 9, and the magnetic shield 38 is provided outside the coil 35. The magnetic shield 38 is connected to the heat transmission portion 8 and the heat dissipation portion 9. Specifically, the magnetic shield 38 is connected to the surfaces 811, 812, 813, 814 and 815 of the base 81 of the heat transmission portion 8. The magnetic shield 38 is connected to the base 91 and outer surfaces of the walls 92 to 95 of the heat dissipation portion 9.

The heater 33 is connected to the outside of the magnetic shield 38. The heater 33 is provided at a wall 381 of the magnetic shield 38 on the −y axis side via the heat transmission plate 39.

As mentioned above, the heat dissipation portion 9 is disposed on an opposite side to the heat transmission portion 8 of the gas cell 31, and the heater 33, the heat transmission portion 8, the gas cell 31, and the heat dissipation portion 9 are arranged in this order from the −y axis side to the +y axis side. According to this configuration, it is possible to effectively heat the gas cell 31 with the heater 33, and also to separate the heat dissipation portion 9 as far apart as possible from the heater 33. Consequently, heat generated from the heater 33 is effectively transmitted to the gas cell 31 by the heat transmission portion 8, and heat from the gas cell 31 is effectively dissipated by the heat dissipation portion 9. Therefore, it is possible to reliably form a low temperature portion in the gas cell 31. Hereinafter, a procedure in which heat generated from the heater 33 is transmitted will be described.

Heat generated from the heater 33 is transmitted to the wall 381 of the magnetic shield 38 on the −y axis through the heat transmission plate 39. The heat generated from the heater 33 is uniformly transmitted to the wall 381 of the magnetic shield 38 by the heat transmission plate 39.

Heat Q which has been transmitted to the wall 381 is transmitted to the heat transmission portion 8. Here, as described above, the second recess 87 into which part of the coil 35 is inserted is formed at the base 81. For this reason, the part of the coil 35 is inserted into the second recess 87, and thus the surface 811 and the surfaces 812 to 815 can be connected to the magnetic shield 38. Therefore, some of the heat Q is transmitted from the surface 811 to the base 81 as heat Q1, and the remaining heat Q is transmitted from the surfaces 811 to 815 to the base 81 as heat Q2. As mentioned above, by using the second recess 87, the part of the coil 35 can be disposed between the heat transmission portion 8 and the magnetic shield 38, an area of a connection part of the base 81 (the heat transmission portion 8) can be sufficiently secured, and thus heat is effectively transmitted from the magnetic shield 38 to the heat transmission portion 8.

Some of the heat Q1+Q2 transmitted to the base 81 is directly transmitted to the gas cell 31 as heat Q3, and the remaining heat is transmitted to the gas cell 31 through the walls 82 to 85 as heat Q4. As mentioned above, the heat transmission portion 8 is connected to the gas cell 31 at the five surfaces, and thus it is possible to secure a sufficient area of connection parts between the heat transmission portion 8 and the gas cell 31. Therefore, it is possible to effectively transmit heat from the heat transmission portion 8 to the gas cell 31.

The heat Q3 and Q4 transmitted to the wall including the pair of windows 312 and 313 of the gas cell 31 is transmitted to the inner space S.

Some of the heat of the gas cell 31 is transmitted to the inner surfaces of the walls 92 to 95 of the heat dissipation portion 9 as heat Q5, and the remaining heat is transmitted to the base 91 of the heat dissipation portion 9 as heat Q6. Some of the heat Q6 is transmitted from the protrusion 314 of the gas cell 31 to the inner surface (the protrusion 314) of the fourth recess 97 of the heat dissipation portion 9 as heat Q7. As mentioned above, the gas cell 31 is connected to the heat dissipation portion 9 at the plurality of surfaces, and thus it is possible to reliably dissipate heat of the gas cell 31. The heat which is dissipated from the gas cell 31 by the heat dissipation portion 9 is dissipated outward through the magnetic shield 38.

As mentioned above, in the gas cell 31, heat generated by the heater 33 is transmitted from the heat transmission portion 8, and is dissipated from the opposite side to the heat transmission portion 8 by the heat dissipation portion 9. Therefore, it is possible to form a low temperature portion whose temperature is lower than that of a peripheral portion in the relatively small gas cell 31.

Since the window 821 is formed at the wall 82, and the window 841 is formed at the wall 84, the excitation light LL passes not through the heat dissipation portion 9 but through the heat transmission portion 8 side. In other words, parts through which the excitation light LL passes in the pair of windows 312 and 313 are located further toward the heat transmission portion 8 side than the heat dissipation portion 9. Consequently, the excitation light LL can pass through regions which are reliably heated, and thus it is possible to prevent the alkali metal from being condensed at the parts through which the excitation light LL passes. Therefore, it is possible to improve oscillation characteristics of the atomic oscillator 1.

As described above, each of the walls 82 to 85 of the heat transmission portion 8 is thinner than each of the walls 92 to 95 of the heat dissipation portion 9. Thus, a sum of areas of the walls 82 to 85 in the +y axis direction is smaller than a sum of the walls 92 to 95 in the −y axis direction. Consequently, it is possible to minimize transmission of heat from the heat transmission portion 8 to the heat dissipation portion 9 through a gap G (for example, air) between the heat transmission portion 8 and the heat dissipation portion 9 when compared with a case where the walls 82 to 85 have the same thicknesses as the walls 92 to 95. Therefore, the atomic oscillator 1 can even further achieve the above-described effect.

The gap G may be filled with a material having relatively low thermal conductivity, such as a resin adhesive.

A region of the inner space S corresponding to the heat dissipation portion 9 is provided at a position different from the part through which the excitation light LL passes, and thus it is possible to more effectively prevent a liquid surplus from shielding an optical path of the excitation light LL. Thus, it is possible to more effectively minimize deterioration in characteristics of the atomic oscillator 1 due to a surplus alkali metal.

Since the protrusion 314 (the liquid reservoir 315) is formed in the gas cell 31, a surplus alkali metal is easily reserved in the liquid reservoir 315. For this reason, it is possible to more effectively prevent the surplus from shielding the optical path of the excitation light LL.

Second Embodiment

Next, a second embodiment of the invention will be described.

Figure 8:
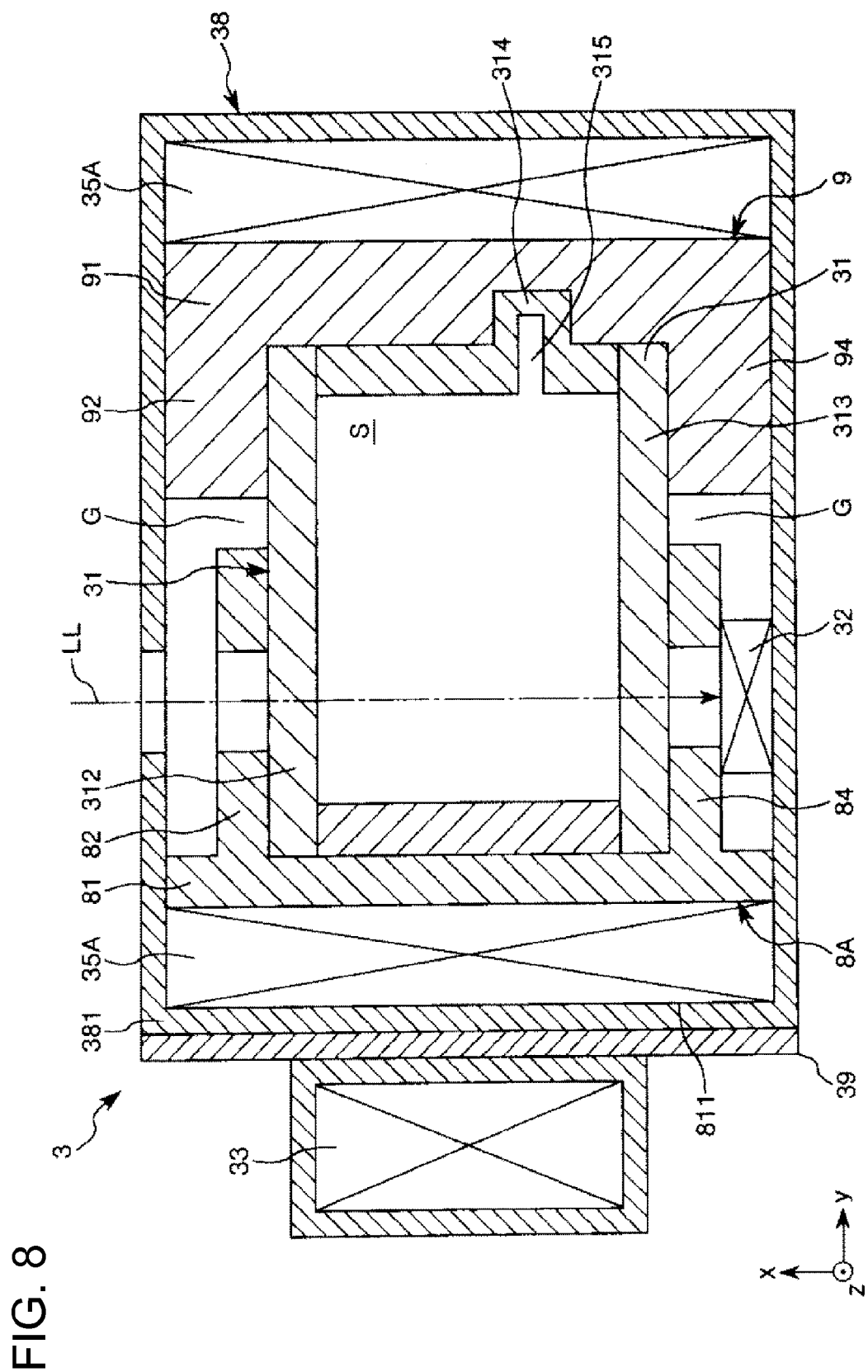
FIG. 8 is a cross-sectional view illustrating a second unit included in an atomic oscillator (quantum interference device) according to a second embodiment of the invention.

FIG. 8 is a cross-sectional view illustrating a second unit included in an atomic oscillator (quantum interference device) according to the second embodiment of the invention.

The present embodiment is the same as the first embodiment except for a difference in a configuration of a heat transmission portion.

Hereinafter, the second embodiment will be described focusing on differences from the first embodiment, and description of the same content will be omitted. In FIG. 8, the same constituent elements as in the above-described embodiment are given the same reference numerals.

As illustrated in FIG. 8, the second recess 87 is omitted from a base 81 of a heat transmission portion 8A and is thus thinner than the base 81 of the heat transmission portion 8 of the first embodiment. Thus, a relatively large coil 35A can be disposed. It is possible to easily manufacture the heat transmission portion 8A from which the second recess 87 is omitted.

The present embodiment can also achieve the same effects as the first embodiment.

The quantum interference device and the atomic oscillator as described above may be incorporated into various electronic apparatuses. These electronic apparatuses have high reliability.

2. Electronic Apparatus

Figure 9:
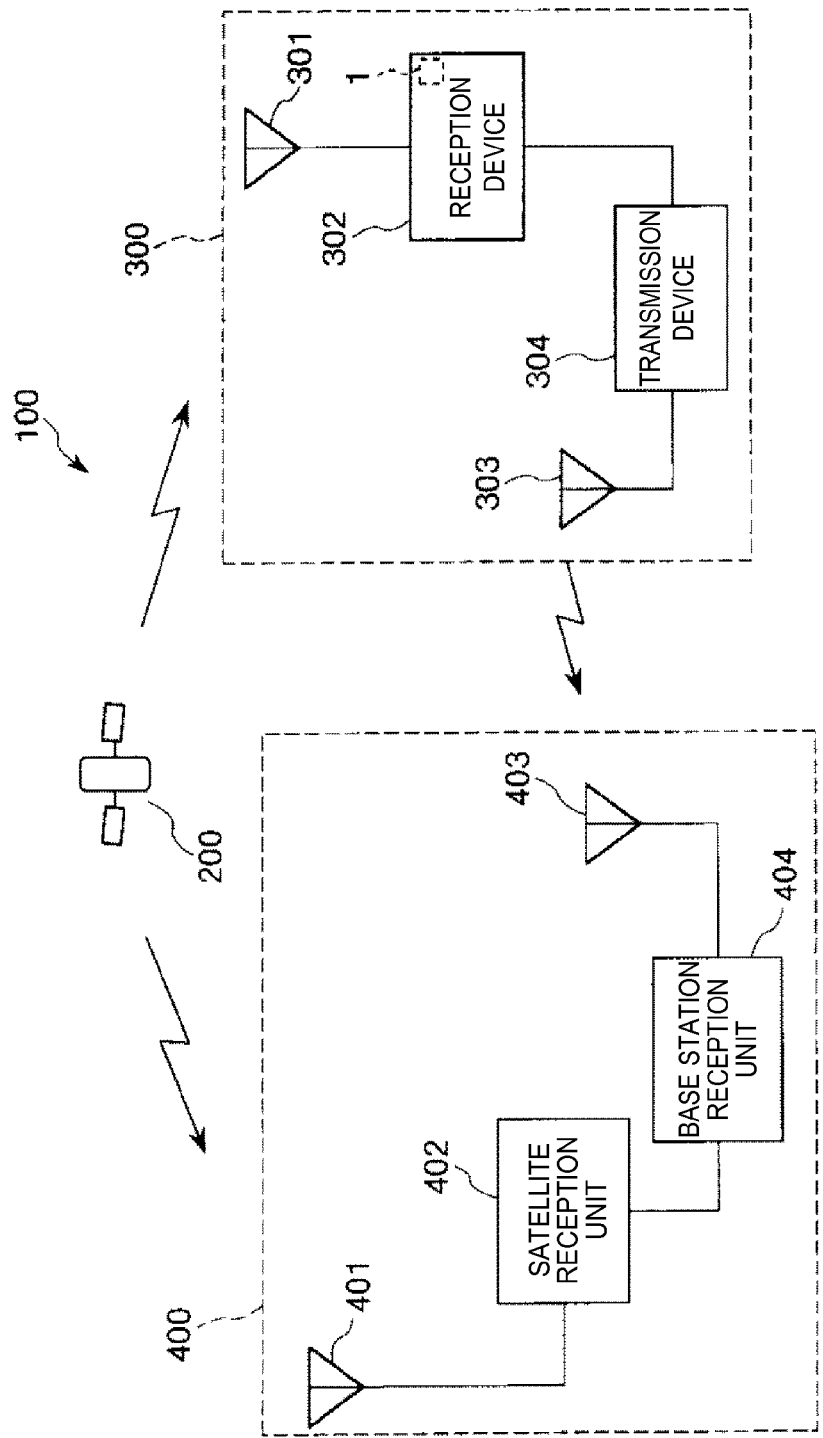
FIG. 9 is a diagram illustrating a schematic configuration in a case where the atomic oscillator (quantum interference device) according to the embodiments of the invention is applied to a positioning system using a GPS satellite.

FIG. 9 is a diagram illustrating a schematic configuration in a case where the atomic oscillator (quantum interference device) according to the embodiments of the invention is applied to a positioning system using a GPS satellite.

A positioning system 100 illustrated in FIG. 9 includes a GPS satellite 200, a base station apparatus 300, and a GPS reception apparatus 400.

The GPS satellite 200 transmits positioning information (GPS signal).

The base station apparatus 300 includes, for example, a reception device 302 which accurately receives the positioning information from the GPS satellite 200 via an antenna 301 which is installed at an electronic reference point (GPS Observation Network of Geographical Survey Institute), and a transmission device 304 which transmits the positioning information received by the reception device 302 via an antenna 303.

Here, the reception device 302 is an electronic apparatus which includes the atomic oscillator 1 according to the embodiment of the invention as a reference frequency oscillation source. The reception device 302 has high reliability. In addition, the positioning information received by the reception device 302 is transmitted to the transmission device 304 in real time.

The GPS reception apparatus 400 includes a satellite reception unit 402 which receives the positioning information from the GPS satellite 200 via an antenna 401, and a base station reception unit 404 which receives the positioning information from the base station apparatus 300 via an antenna 403.

3. Moving object

Figure 10:
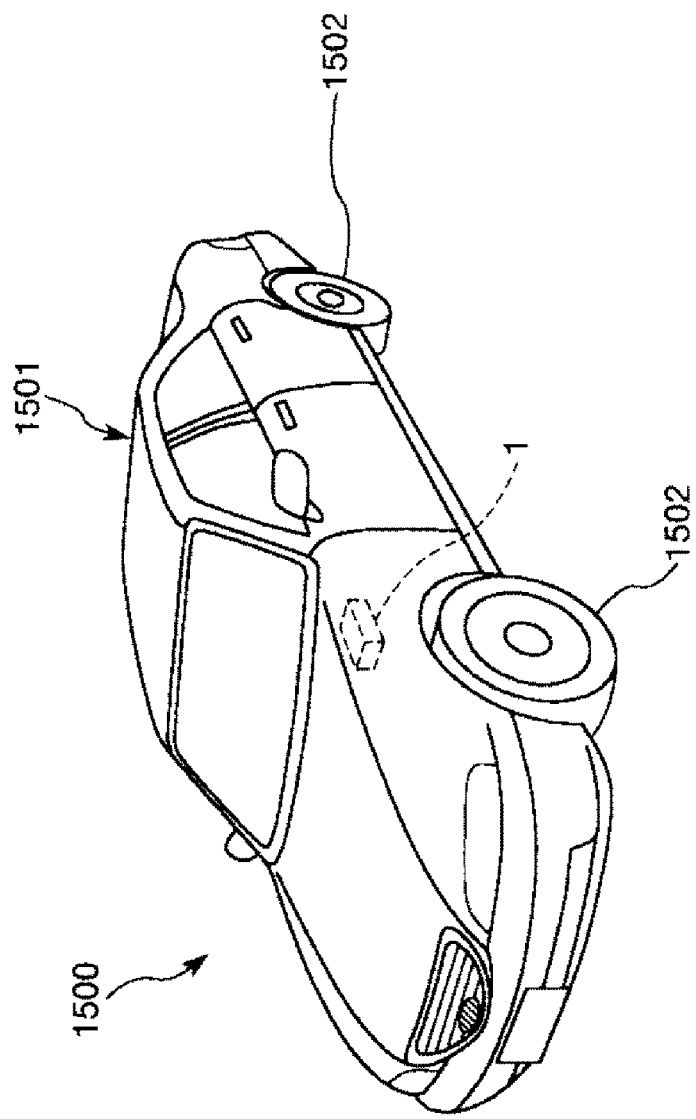
FIG. 10 is a diagram illustrating an example of a moving object according to an embodiment of the invention.

FIG. 10 is a diagram illustrating an example of a moving object according to an embodiment of the invention.

In FIG. 10, a moving object 1500 has a car body 1501 and four wheels 1502, and the wheels 1502 are rotated by a power source (engine) not shown provided in the car body 1501. The atomic oscillator 1 is built into the moving object 1500.

Such a moving object has high reliability.

In addition, electronic apparatuses having the atomic oscillator and the quantum interference device according to the embodiment of the invention are not limited thereto, and may be applied to, for example, a mobile phone, a digital still camera, an inkjet type ejection apparatus (for example, an ink jet printer), a personal computer (a mobile type personal computer or a laptop type personal computer), a television, a video camera, a video tape recorder, a car navigation apparatus, a pager, an electronic organizer (including a communication function), an electronic dictionary, an electronic calculator, an electronic gaming machine, a wordprocessor, a workstation, a videophone, a security television monitor, an electronic binocular, a POS terminal, a medical apparatus (for example, an electronic thermometer, a sphygmomanometer, a blood glucose monitoring system, an electrocardiographic apparatus, an ultrasonic diagnostic apparatus, or an electronic endoscope), a fish-finder, various measurement apparatuses, meters and gauges (for example, meters and gauges of vehicles, aircrafts, and ships), a flight simulator, a terrestrial digital broadcast, and a mobile phone base station.

As mentioned above, the quantum interference device, the atomic oscillator, the electronic apparatus, and the moving object according to the embodiments of the invention have been described with reference to the drawings, but the invention is not limited thereto.

In the quantum interference device, the atomic oscillator, the electronic apparatus, and the moving object according to the embodiments of the invention, a configuration of each part may be replaced with any configuration showing the same function as in the above-described embodiments, and any configuration may be added thereto.

The quantum interference device, the atomic oscillator, the electronic apparatus, and the moving object according to the embodiments of the invention may cover a combination of arbitrary configurations of the respective embodiments.

Each wall of the heat transmission portion may have the same thickness as that of each wall of the heat dissipation portion.

In relation to the coil, a pair of coils may oppose each other with the gas cell interposed therebetween so as to form Helmholtz coils.

The portions constituting the second unit may be fixed to certain positions. A fixation method thereof is not limited thereto, and the portions may be fixed to a certain position, for example, by using adhesion using an adhesive, fusion, or by fitting the portions to each other.

Each of the portions constituting the second unit may be fixed to a certain position through fusion.

The entire disclosure of Japanese Patent Application No. 2013-264663, filed Dec. 20, 2013 is expressly incorporated by reference herein.

What is claimed is:

1. A quantum interference device comprising:
   a gas cell into which metal atoms are sealed;
   a heating portion that heats the gas cell;
   a heat transmission portion that is located between the gas cell and the heating portion, that is connected to a first part of the gas cell, and that transmits heat generated from the heating portion to the gas cell; and
   a heat dissipation portion that is connected to a second part, which is different from the first part, of the gas cell, wherein
   the heat transmission portion and the heat dissipation portion are spaced apart from each other by a gap.

2. The quantum interference device according to claim 1, wherein the heat dissipation portion is disposed on an opposite side to the heating portion side of the gas cell.

3. The quantum interference device according to claim 2, wherein the gas cell includes a pair of windows through which light is transmitted in part of the first part, and
   wherein the heat transmission portion is connected to each of the windows.

4. The quantum interference device according to claim 1, further comprising:
   a coil that generates a magnetic field in the gas cell,
   wherein the heat transmission portion, the gas cell, and the heat dissipation portion are located inside the coil, and
   wherein the heating portion is located outside the coil.

5. The quantum interference device according to claim 4, further comprising:
   a magnetic shield that has a magnetic shield property and that is located between the coil and the heating portion.

6. The quantum interference device according to claim 5, wherein the heating portion is connected to the magnetic shield.

7. The quantum interference device according to claim 1, wherein an end of the heat transmission portion on the heat dissipation portion side and an end of the heat dissipation portion on the heat transmission portion side face each other, and have facing areas different from each other.

8. An atomic oscillator comprising the quantum interference device according to claim 1.

9. An electronic apparatus comprising the quantum interference device according to claim 1.

10. A moving object comprising the quantum interference device according to claim 1.

* * * * *